(12) United States Patent
Low et al.

(10) Patent No.: US 11,444,225 B2
(45) Date of Patent: Sep. 13, 2022

(54) LIGHT EMITTING DIODE PACKAGE HAVING A PROTECTIVE COATING

(71) Applicants: Tek Beng Low, Melaka (MY); Chee Sheng Lim, Melaka (MY)

(72) Inventors: Tek Beng Low, Melaka (MY); Chee Sheng Lim, Melaka (MY)

(73) Assignee: Dominant Opto Technologies SDN BHD

( * ) Notice: Subject to any disclaimer, the term of this patent is extended or adjusted under 35 U.S.C. 154(b) by 100 days.

(21) Appl. No.: 17/013,985

(22) Filed: Sep. 8, 2020

(65) Prior Publication Data

US 2022/0077359 A1 Mar. 10, 2022

(51) Int. Cl.
H01L 33/56 (2010.01)
H01L 33/54 (2010.01)

(52) U.S. Cl.
CPC .............. *H01L 33/56* (2013.01); *H01L 33/54* (2013.01)

(58) Field of Classification Search
CPC ...................................................... H01L 33/56
See application file for complete search history.

(56) References Cited

U.S. PATENT DOCUMENTS

| | | | |
|---|---|---|---|
| 5,291,038 A | 3/1994 | Hanamoto et al. |
| 6,181,003 B1 | 1/2001 | Ohuchi |
| 6,355,946 B1 | 3/2002 | Ishinaga |
| 6,407,411 B1 | 6/2002 | Wojnarowski et al. |
| 6,744,077 B2 | 6/2004 | Trottier et al. |
| 6,762,551 B2 | 7/2004 | Shiiki et al. |
| 6,890,085 B2 | 5/2005 | Hacker |
| 7,038,370 B2 | 5/2006 | Mueller-Mach et al. |
| 7,083,302 B2 | 8/2006 | Chen et al. |
| 7,646,029 B2 | 1/2010 | Mueller et al. |
| 7,655,957 B2 | 2/2010 | Loh et al. |
| 7,943,941 B2 | 5/2011 | Shimizu et al. |
| 8,299,701 B2 | 10/2012 | Kolodin et al. |
| 8,314,479 B2 | 11/2012 | Wai et al. |
| 8,394,675 B2 | 3/2013 | Wai et al. |
| 8,564,005 B2 | 10/2013 | Park et al. |
| 8,674,488 B2 | 3/2014 | Wai et al. |
| 8,685,762 B2 | 4/2014 | Shimizu et al. |
| 8,829,780 B2 | 9/2014 | Sakuta et al. |

(Continued)

FOREIGN PATENT DOCUMENTS

| | | |
|---|---|---|
| WO | WO 2009/072786 | 6/2009 |
| WO | WO 2009/082177 | 7/2009 |
| WO | WO 2015/059258 | 4/2015 |

*Primary Examiner* — Jay C Chang
*Assistant Examiner* — Mikka Liu
(74) *Attorney, Agent, or Firm* — King & Partners, PLC

(57) ABSTRACT

A light emitting diode package, including: a housing, wherein the housing includes a top section having an aperture; a lead frame associated with the housing, wherein the lead frame includes a first electrode and a second electrode; a light emitting diode light source, wherein the light emitting diode light source is associated with the aperture of the housing; an encapsulant, wherein the encapsulant is associated with at least a portion of the light emitting diode light source and the housing; and a protective coating associated with at least a portion of the encapsulant and the housing, wherein the protective coating reduces and/or eliminates oxidative degradation, thermal degradation, and/or photo-degradation.

5 Claims, 7 Drawing Sheets

(56) References Cited

U.S. PATENT DOCUMENTS

| | | | |
|---|---|---|---|
| 8,890,403 B2 | 11/2014 | Sakuta et al. | |
| 9,252,347 B2 | 2/2016 | Kong et al. | |
| 9,559,275 B2 | 1/2017 | Kong et al. | |
| 9,647,181 B2 | 5/2017 | Ishizaki | |
| 9,853,194 B2 | 12/2017 | Minato et al. | |
| 9,905,736 B2 | 2/2018 | Seki et al. | |
| 9,954,145 B2 | 4/2018 | Radkov et al. | |
| 9,985,182 B2 | 5/2018 | Watanabe et al. | |
| 10,468,564 B1 | 11/2019 | Zhao et al. | |
| 2002/0180345 A1 | 12/2002 | Hen | |
| 2003/0116769 A1 | 6/2003 | Song et al. | |
| 2005/0006794 A1 | 1/2005 | Kashiwagi et al. | |
| 2005/0179041 A1 | 8/2005 | Harbers et al. | |
| 2006/0012299 A1 | 1/2006 | Suehiro et al. | |
| 2006/0108669 A1 | 5/2006 | Matsumoto et al. | |
| 2008/0180948 A1 | 7/2008 | Yoon et al. | |
| 2010/0065879 A1* | 3/2010 | Kirsch | H01L 33/483 257/E33.056 |
| 2011/0291143 A1* | 12/2011 | Kim | H01L 33/60 438/27 |
| 2015/0340569 A1* | 11/2015 | Tamaki | H01L 33/62 257/98 |
| 2016/0104820 A1 | 4/2016 | Lim | |
| 2016/0276549 A1 | 9/2016 | Yamashita et al. | |
| 2018/0287019 A1 | 10/2018 | Hashimoto et al. | |
| 2022/0029074 A1* | 1/2022 | Reeswinkel | H01L 33/54 |

* cited by examiner

LIGHT EMITTING DIODE PACKAGE HAVING A PROTECTIVE COATING

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A SEQUENCE LISTING

Not applicable.

BACKGROUND OF THE INVENTION

1. Field of the Invention

The present invention relates in general to light emitting diode (LED) packages, and more particularly, to improved light emitting diode packages that include a single layer or multiple layers of a protective coating (e.g., the same material or different materials) that are associated with at least a portion of the LED package surface, which help to reduce and/or eliminate problems associated with oxidative degradation (e.g., corrosion, etcetera), thermal degradation (e.g., physical, chemical, etcetera), and/or photodegradation (e.g., physical, chemical, etcetera).

2. Background Art

By way of background, conventional semiconductor packages typically consist of an outer housing that protects the semiconductor device within. The protection is both against mechanical damage and also the environment. The opaque material of the housing typically has low permeability to air and moisture in order to provide protection from the environment. However, LED packages are unique. Due to the need to transmit light, there is a need for a transparent or translucent portion that encapsulates the semiconductor device. Examples of such material include clear epoxy resins and silicones. Inherently, such materials typically have high permeability characteristics to air and moisture. The very structure of a LED package consisting of a hard, opaque housing to provide mechanical strength and a transparent or translucent portion to transmit light lead to additional interfaces that undesirably lead to higher permeability of air and moisture. The present invention discloses an improved light emitting diode package that includes one or more or protective coatings and/or layers, associated with at least a portion of the LED package surface, which help to materially reduce and/or eliminate problems associated with the additional interfaces that lead to higher permeability of air and moisture.

By way of additional background, LED packages and encapsulants associated with LED packages have been known in the art for years, and are the subject of a plurality of patents and publications, including: U.S. Pat. No. 9,559,275 entitled "Light Emitting Device Package and Light Unit Having the Same," U.S. Pat. No. 8,564,005 entitled "Light-Emitting Device Package," U.S. Pat. No. 8,394,675 entitled "Manufacturing Light Emitting Diode (LED) Packages," U.S. Pat. No. 8,314,479 entitled "Leadframe Package with Recessed Cavity for LED," U.S. Pat. No. 7,646,029 entitled "LED Package Methods and Systems," U.S. Pat. No. 6,407,411 entitled "LED Lead Frame Assembly," United States Patent Application Publication Number 2005/0179041 entitled "Illumination System with LEDs," United States Patent Application Publication Number 2005/0006794 entitled "Silicone Rubber Composition, Light-Emitting Semiconductor Embedding/Protecting Material and Light-Emitting Semiconductor Device," United States Patent Application Publication Number 2003/0116769 entitled "Light Emission Diode Package," United States Patent Application Publication Number 2002/0180345 entitled "Package Structure Containing Two LEDs," International Application Publication Number WO 2015/059258 entitled "LED Encapsulant," International Application Publication Number WO 2009/082177 entitled "Light Emitting Diode Package," and International Application Publication Number WO 2009/072786 entitled "LED Package and Method for Fabricating the Same"—all of which are hereby incorporated herein by reference in their entirety including all references cited therein.

U.S. Pat. No. 9,559,275 appears to disclose a light emitting device package. The light emitting device is a package body that includes a first recess which is provided with a bottom face and a plurality of inner walls surrounding the bottom face, the plurality of inner walls including a first inner wall and a second inner wall, which are opposing walls; a lead frame exposed at the bottom face of the package body, the lead frame including a bottom frame and a reflector exposed along one of the first inner wall and the second inner wall; a light emitting element provided on the lead frame; and a transparent material provided in the package body to cover the light emitting element. A material of the reflector is the same as a material of the bottom frame of the lead frame.

U.S. Pat. No. 8,564,005 appears to disclose a light-emitting device package including: a package main body including a cavity and a lead frame including a mounting portion disposed in the cavity and a plurality of terminal portions; a light-emitting device chip mounted on the mounting portion; a plurality of bonding wires for electrically connecting the plurality of terminal portions and the light-emitting device chip; a light-transmitting encapsulation layer filled in the cavity; and a light-transmitting cap member disposed in the cavity and blocking the encapsulation layer to contact the plurality of bonding wires.

U.S. Pat. No. 8,394,675 appears to disclose a method of manufacturing an LED package that includes mounting a large panel frame/substrate (LPF/S) having a substantially square shape to a ring. The LPF/S includes a plurality of die pads and a corresponding plurality of leads arranged in a matrix pattern. Each of the die pads includes a planar chip attach surface. An LED chip is attached to the planar chip attach surface of each of the die pads. An encapsulant material is applied overlaying the LED chips and at least a part of the LPF/S. Each die pad and corresponding leads are separated from the LPF/S to form individual LED packages. The steps of attaching the LED chips and applying the encapsulant material are performed while the LPF/S is mounted to the ring.

U.S. Pat. No. 8,314,479 appears to disclose an LED package that includes a die pad having a bottom surface, an upper surface and a centrally located recessed cavity. The recessed cavity has a chip attach surface between the bottom surface and upper surface and sidewalls that extend from the recessed chip attach surface to the upper surface. The package additionally has leads arranged on opposing sides of the die pad. The leads have a bottom surface that is coextensive with the bottom surface of the die pad and an upper surface coextensive with the upper surface of the die pad. An LED chip is attached to the chip attach surface. The package further includes a package body having an encapsulant which fills space between the die pad and leads forming a bottom encapsulant surface that is coextensive with the bottom surfaces of the die pad and leads.

U.S. Pat. No. 7,646,029 appears to disclose methods and systems for LED modules that include an LED die integrated in an LED package with a sub-mount that includes an electronic component for controlling the light emitted by the LED die. The electronic component integrated in the sub-mount may include drive hardware, a network interface, memory, a processor, a switch-mode power supply, a power facility, or another type of electronic component.

U.S. Pat. No. 6,407,411 appears to disclose an improved LED lead frame packaging assembly that includes a thermally conducting, electrically insulating material that enhances the thermal conduction and structural integrity of the assembly, a UV-resistant encapsulant material, and an integral ESD material that reduces electrostatic discharge. The thermally conducting, electrically insulating material creates an electrically insulating, thermally conductive path in the lead frame assembly for dissipation of power and also acts as a mounting structure thus allowing for the use of a soft encapsulant material, preferably a silicone.

United States Patent Application Publication Number 2005/0179041 appears to disclose a system that includes a light emitting diode (LED), such as a projection system, which may be increased by using an LED chip that has a light emitting surface that emits light directly into any medium with a refractive index of less than or equal to approximately 1.25. For example, the LED chip may emit light directly into the ambient environment, such as air or gas, instead of into an encapsulant. The low refractive index decreases the étendue of the LED, which increases luminance. Moreover, without an encapsulant, a collimating optical element, such as a lens, can be positioned close to the light emitting surface of the LED chip, which advantageously permits the capture of light emitted at large angles. A secondary collimating optical element may be used to assist in focusing the light on a target, such as a microdisplay.

United States Patent Application Publication Number 2005/0006794 appears to disclose a silicone rubber composition, comprising: (A) an organopolysiloxane containing at least two aliphatic unsaturated bonds; (B) an organopolysiloxane of resin structure comprising $SiO_2$ units, $R^3{}_nR^4{}_pSiO_{0.5}$ units and $R^3{}_qR^4{}_rSiO_{0.5}$ units wherein $R^3$ is vinyl or allyl, $R^4$ is a monovalent hydrocarbon group free of aliphatic unsaturation, n is 2 or 3, p is 0 or 1, n+p=3, q is 0 or 1, r is 2 or 3, and q+r=3; (C) an organohydrogenpolysiloxane having at least two SiH groups; and (D) a platinum catalyst cures into a silicone rubber having excellent rubbery and strength properties and little surface tack.

United States Patent Application Publication Number 2003/0116769 appears to disclose an LED package, made of ceramic substrates and having a reflective metal plate. This LED package consists of a first ceramic substrate, which has a chip mounting area on its top surface, and is provided with a predetermined conductive pattern formed around the chip mounting area. One or more LED chips are seated on the chip mounting area of the first ceramic substrate, and are connected to the conductive pattern. A second ceramic substrate is mounted on the top surface of the first ceramic substrate and has a cavity at a position corresponding to the chip mounting area. The reflective metal plate is set in the cavity of the second ceramic substrate to surround the LED chips. This LED package effectively controls the luminous intensity of the LED chips and the angular distribution of the luminance. The reflective metal plate also collaterally acts as a heat sink effectively dissipating heat from the LED chips to the surroundings of the LED package.

United States Patent Application Publication Number 2002/0180345 appears to disclose a package structure containing two LEDs (light emitting diodes), which are packaged in cascade and capable of emitting lights with different wavelengths. For example, by packaging a yellow LED die above a blue LED die or packaging a blue LED die above a yellow LED die, a desaturated blue, desaturated yellow or white light can be obtained when a blue light is emitted through a yellow light or a yellow light is emitted through a blue light. The present invention can be a single-anode-single-cathode or a double-anode-single-cathode package structure, wherein the latter structure can continually change the emitted light in a certain range by adjusting input voltages of the anodes.

International Application Publication Number WO 2015/059258 appears to disclose an LED encapsulant comprising a scattering particle mixture, which includes: (i) a linear polymer including a dimethylsiloxane group which has a vinyl end substituent and/or a linear polymer including a methylphenylsiloxane group which has a vinyl end substituent; and (ii) at least one vinyl-based resin selected from the group consisting of a vinyl-based ViMQ resin.

International Application Publication Number WO 2009/082177 appears to disclose a light emitting diode (LED) package that includes a light emitting diode (LED) package that includes a pair of lead frames connected with at least one LED chip through a metal wire, a package body integrally fixed with the lead frames and having a cavity having an open top, a lead frame bent downwardly to a lower part of an external mounting surface of the package body, a light-transmissive, transparent resin covering the LED chip and filling the cavity, a recess formed in a bottom surface of the cavity, in which the LED chip is mounted, and a transparent resin including a fluorescent material formed in the recess and the cavity. Accordingly, the amount of light-transmissive, transparent resin filling the cavity is reduced to save on manufacturing costs, and the height of the resin is lowered to improve the luminance of light. Also, the height of the package body is lowered, contributing to manufacturing a small product.

International Application Publication Number WO 2009/072786 appears to disclose an LED package that comprises a base having an LED chip mounted thereon, an encapsulation member formed by a light-transmittable resin to encapsulate the LED chip, and a housing formed to expose a top portion of the encapsulation member and to encompass a side surface of the encapsulation member, wherein the encapsulation member is formed by a transfer molding process using a mold to have a predetermined shape. Further, the housing may be light-transmittable.

While the above-identified patents and publications do appear to disclose a plurality of LED package and encapsulant configurations, none of the above-identified patents and publications appear to disclose an improved light emitting diode package that includes one or more or protective coatings and/or layers, associated with at least a portion of the LED package surface, which help to materially reduce and/or eliminate problems associated with oxidative degradation, thermal degradation, and/or photodegradation.

These and other objects of the present invention will become apparent in light of the present specification, claims, and drawings.

SUMMARY OF THE INVENTION

The present invention is directed to a light emitting diode package comprising, consisting essentially of, and/or consisting of: (a) a housing, wherein the housing comprises a top section having an aperture and an optional bottom section; (b) a lead frame associated with the housing, wherein the lead frame comprises a first electrode and a second electrode; (c) a light emitting diode light source, wherein the light emitting diode light source is associated with the aperture of the housing; (d) an encapsulant, wherein the encapsulant is associated with at least a portion of the light emitting diode light source and the housing; and (e) a protective coating associated with at least a portion of the encapsulant and the housing.

The present invention is directed to a light emitting diode package comprising, consisting essentially of, and/or consisting of: (a) a lead frame, wherein the lead frame comprises a first electrode and a second electrode; (b) a light emitting diode light source; (c) an encapsulant, wherein the encapsulant is associated with at least a portion of the light emitting diode light source; and (d) a protective coating associated with at least a portion of the encapsulant.

In a preferred embodiment of the present invention, the protective coating reduces and/or eliminates oxidative degradation (e.g., corrosion), thermal degradation, and/or photodegradation.

In another preferred embodiment of the present invention, the protective coating covers the top surface of the encapsulant and, if present, the top surface of the housing.

In yet another preferred embodiment of the present invention, the protective coating is thin and translucent and/or transparent.

In a preferred embodiment of the present invention, the protective coating comprises a UV and/or heated cured silicone resin.

In another preferred embodiment of the present invention, the protective coating comprises an epoxy resin and/or any form of a silicone system.

In yet another preferred embodiment of the present invention, the light emitting diode package further comprises a secondary protective coating positioned on top of the first protective coating. In this embodiment, the secondary protective coating may comprise a single layer or multiple layers and may be made from the same or different material as the first protective coating.

BRIEF DESCRIPTION OF THE DRAWINGS

Certain embodiments of the present invention are illustrated by the accompanying figures. It will be understood that the figures are not necessarily to scale and that details not necessary for an understanding of the invention or that render other details difficult to perceive may be omitted.

It will be further understood that the invention is not necessarily limited to the particular embodiments illustrated herein.

Figure 1:
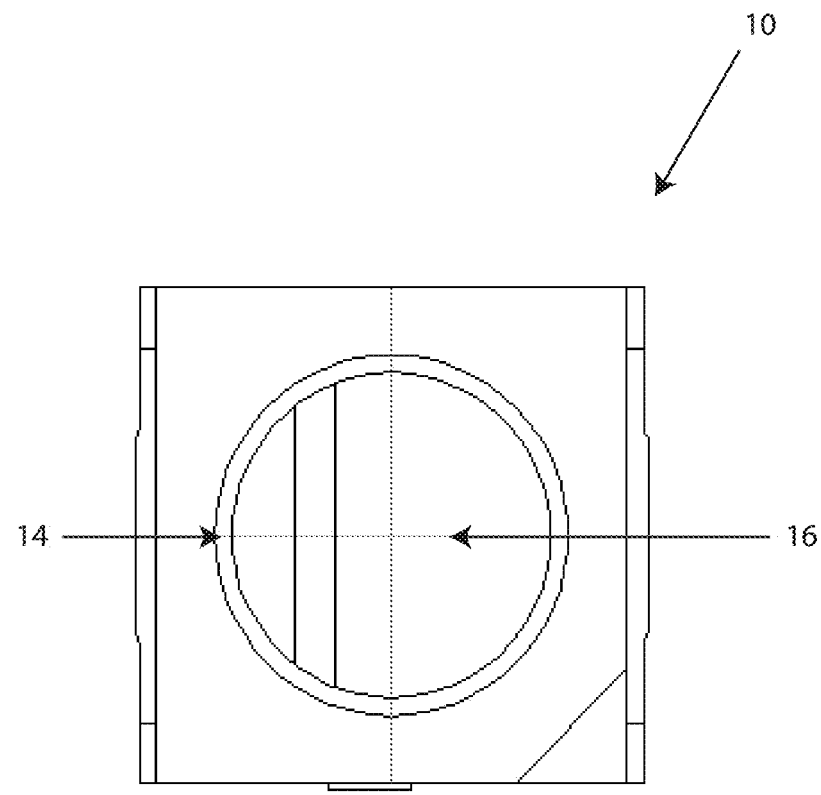
Figure 2:
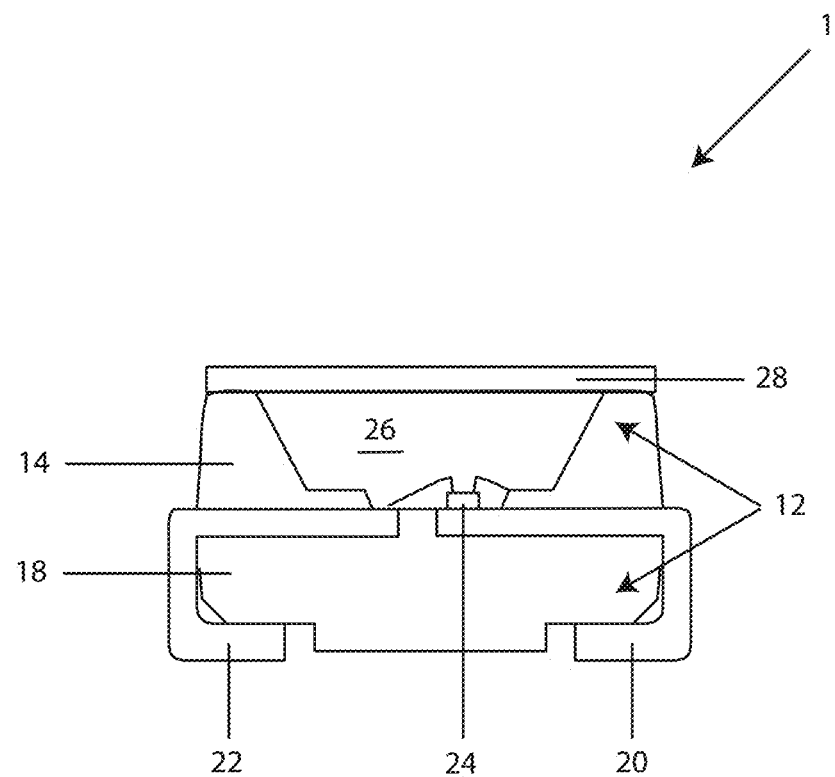
Figure 3:
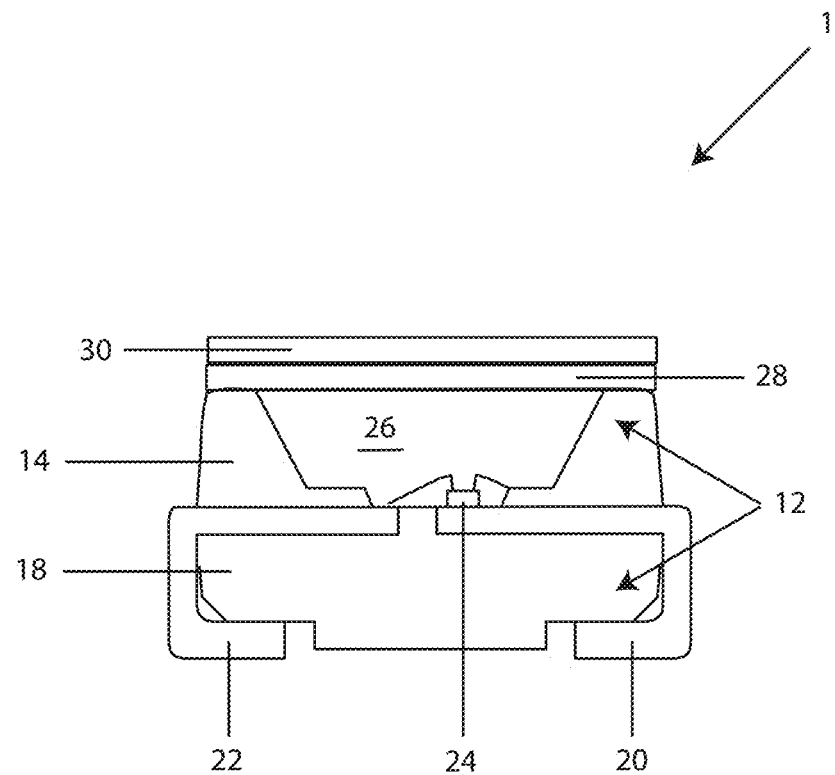
Figure 4:
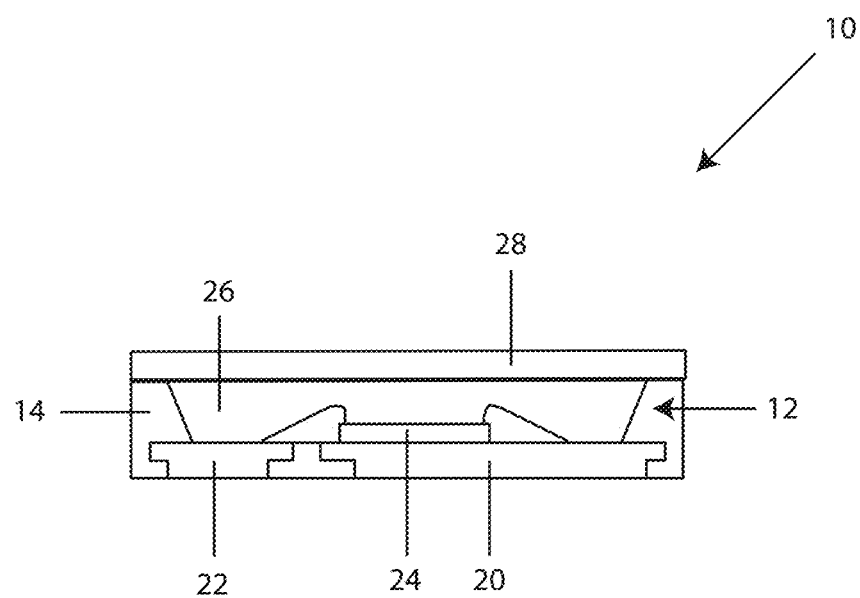
Figure 5:
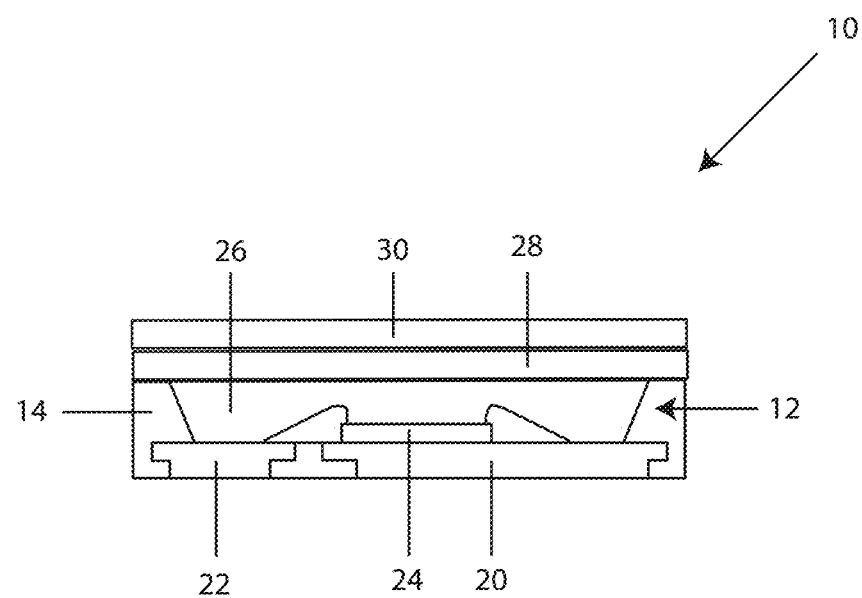
Figure 6:
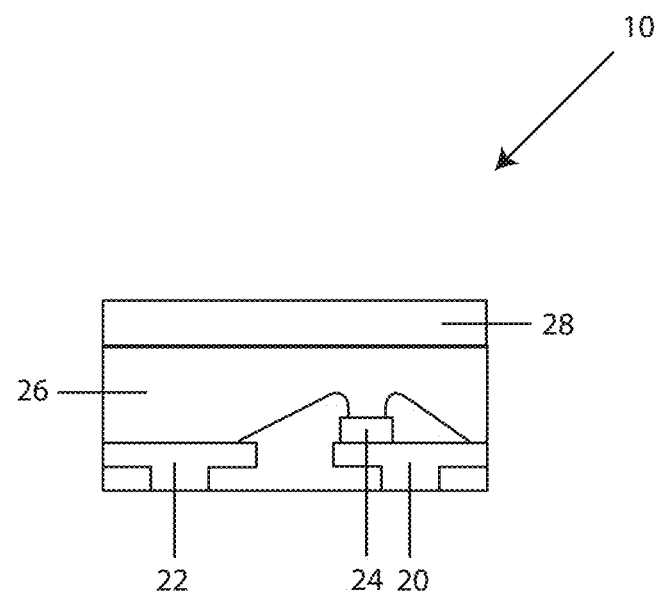
Figure 7:
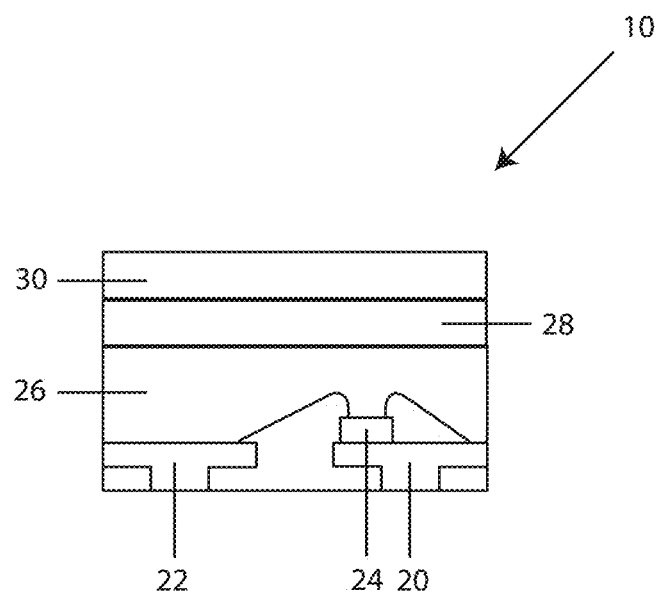

The invention will now be described with reference to the drawings wherein:

FIG. 1 is a top view of a light emitting diode package fabricated in accordance with the present invention;

FIG. 2 is a cross-sectional view of a first embodiment of a light emitting diode package fabricated in accordance with the present invention;

FIG. 3 is a cross-sectional view of a second embodiment of a light emitting diode package fabricated in accordance with the present invention;

FIG. 4 is a cross-sectional view of a third embodiment of a light emitting diode package fabricated in accordance with the present invention;

FIG. 5 is a cross-sectional view of a fourth embodiment of a light emitting diode package fabricated in accordance with the present invention;

FIG. 6 is a cross-sectional view of a fifth embodiment of a light emitting diode package fabricated in accordance with the present invention; and FIG. 7 is a cross-sectional view of a sixth embodiment of a light emitting diode package fabricated in accordance with the present invention.

DETAILED DESCRIPTION OF THE INVENTION

While this invention is susceptible of embodiment in many different forms, there is shown in the drawings and described herein in detail several specific embodiments with the understanding that the present disclosure is to be considered as an exemplification of the principles of the invention and is not intended to limit the invention to the embodiments illustrated.

It will be understood that like or analogous elements and/or components, referred to herein, may be identified throughout the drawings by like reference characters. In addition, it will be understood that the drawings are merely schematic representations of one or more embodiments of the invention, and some of the components may have been distorted from their actual scale for purposes of pictorial clarity.

Referring collectively now to FIGS. 1-2, light emitting diode package 10 of the present invention generally includes: housing or body 12 that includes top section 14 (typically opaque) having aperture 16 and bottom section 18 (typically opaque); lead frame/lead terminals associated with first electrode 20 (e.g., an anode fabricated from a transition metal, copper, lead, nickel, silver, gold, palladium, and combinations thereof) and second electrode 22 (e.g., an cathode fabricated from a transition metal, copper, lead, nickel, silver, gold, palladium, and combinations thereof); light emitting diode light source 24, wherein the light emitting diode light source is associated with aperture 16 of housing 12; encapsulant 26 (preferably fabricated from an epoxy resin, a silicone resin, a modified-silicone resin, and combinations thereof), wherein the encapsulant is associated with at least a portion of the light emitting diode light source 24 and housing 12; and protective coating 28 preferably associated with at least a portion of encapsulant 26 and/or housing 12.

In accordance with the present invention, protective coating 28 reduces and/or eliminates oxidative degradation (e.g., corrosion), thermal degradation, and/or photodegradation.

In one embodiment of the present invention, protective coating 28 covers the top surfaces of both encapsulant 26 and housing 12.

Preferably, protective coating 28 is "thin" and ranges in thickness from approximately 1 to approximately 25 microns, and more preferably from approximately 3 to approximately 15 microns. In this embodiment the protective coating is substantially transparent and/or transparent. In other embodiments the protective coating is clear and colorless.

In another preferred embodiment of the present invention, protective coating 28 comprises an oxygen permeability of less than 500 cc/m$^2$/day, and more preferably less than 250 cc/m$^2$/day.

In yet another preferred embodiment of the present invention, protective coating 28 comprises a light transmissivity of at least 75%, and more preferably at least 90%.

In a preferred embodiment of the present invention, protective coating 28 ranges in refractive index from approximately 1.35 to approximately 1.45, and more preferably from approximately 1.37 to approximately 1.43.

In one embodiment of the present invention, protective coating 28 consists of a refractive index of 1.41.

In another preferred embodiment of the present invention, protective coating 28 is fabricated from a UV and/or heated cured silicone resin.

In yet another preferred embodiment of the present invention, protective coating 28 comprises a methyl-based silicone polymer.

In yet another preferred embodiment of the present invention, protective coating 28 comprises an epoxy resin and/or any form of a silicone system.

Protective coating 28 is preferably associated with encapsulant 26 and/or housing 12 via one or more conventional techniques, such as impregnating, etch coating, dip coating, spin coating, brush coating and/or spray coating.

In a preferred embodiment of the present invention, the protective coating optionally comprises a UV-tracking composition.

As is best shown in FIGS. 3, 5, and 7, in certain embodiments of the present invention, light emitting diode package 10 may optionally comprise secondary protective coating, top coat, or cap 30 positioned on top of first protective coating 28. In this embodiment, secondary protective coating 30 may comprise the same or different thickness as first protective coating 28, and/or may be fabricated from the same or different materials as first protective coating 28.

Additional suitable materials include, for example, any one of a number of materials that are transparent or substantially transparent in the visible region of the electromagnetic spectrum, such as, for example, borosilicate glass, soda lime glass, natural and synthetic polymeric resins, plastics, and/or composites including polyesters (e.g. PET), polyimides (PI), polycarbonates, glass-clad polycarbonates (GCP) polysulfones, polyamides, polyethylene naphthalate (PEN), ethylene vinyl acetate (EVA), acrylate polymers, as well as Topas®, which is commercially available from Ticona of Summit, N.J.

Referring now to FIGS. 4-5, and in other embodiments of the present invention, light emitting diode package 10 generally includes: housing or body 12 that includes top section 14 (typically opaque) having aperture 16; lead frame/lead terminals associated with first electrode 20 (e.g., an anode fabricated from a transition metal, copper, lead, nickel, silver, gold, palladium, and combinations thereof) and second electrode 22 (e.g., an cathode fabricated from a transition metal, copper, lead, nickel, silver, gold, palladium, and combinations thereof); light emitting diode light source 24, wherein the light emitting diode light source is associated with aperture 16 of housing 12; encapsulant 26 (preferably fabricated from an epoxy resin, a silicone resin, a modified-silicone resin, and combinations thereof), wherein the encapsulant is associated with at least a portion of the light emitting diode light source 24 and housing 12; and protective coating 28 preferably associated with at least a portion of encapsulant 26 and/or housing 12. In this embodiment, the light emitting diode package 10 is void of a bottom section frame, and the top section and/or encapsulant provide the structural support for the package.

Referring now to FIGS. 6-7, and in other embodiments of the present invention, light emitting diode package 10 generally includes: lead frame/lead terminals associated with first electrode 20 (e.g., an anode fabricated from a transition metal, copper, lead, nickel, silver, gold, palladium, and combinations thereof) and second electrode 22 (e.g., an cathode fabricated from a transition metal, copper, lead, nickel, silver, gold, palladium, and combinations thereof); light emitting diode light source 24; encapsulant 26 (preferably fabricated from an epoxy resin, a silicone resin, a modified-silicone resin, and combinations thereof); and protective coating 28 preferably associated with at least a portion of encapsulant 26. In this embodiment, the light emitting diode package 10 is void of frame 10 and encapsulant 26 provides the structural support for the package.

The foregoing description merely explains and illustrates the invention and the invention is not limited thereto except insofar as the appended claims are so limited, as those skilled in the art who have the disclosure before them will be able to make modifications without departing from the scope of the invention.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etcetera shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etcetera. As a non-limiting example, each range discussed herein can be readily broken down into a lower third, middle third and upper third, etcetera. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed and desired to be secured by Letters Patent of the United States is:

1. A light emitting diode package, comprising:
   a lead frame, wherein the lead frame comprises a first electrode and a second electrode;
   a light emitting diode light source;
   an encapsulant, wherein the encapsulant is associated with at least a portion of the light emitting diode light source;
   a protective coating associated with at least a portion of the encapsulant, wherein the protective coating ranges in thickness from 1 micron to 25 microns, and wherein the protective coating comprises an oxygen permeability of less than 500 cc/m2/day, and wherein the protective coating comprises a light transmissivity of at least 75%;
   wherein the light emitting diode package is void of a housing; and
   wherein a secondary protective coating is positioned on top of the protective coating.

2. The light emitting diode package according to claim 1, wherein the protective coating covers a top surface of the encapsulant.

3. The light emitting diode package according to claim 1, wherein the protective coating is thin and translucent and/or transparent.

4. The light emitting diode package according to claim 1, wherein the protective coating comprises a UV and/or heated cured silicone resin.

5. The light emitting diode package according to claim 1, wherein the protective coating comprises an epoxy resin and/or any form of a silicone system.

* * * * *